US009558980B2

(12) United States Patent
Lee et al.

(10) Patent No.: US 9,558,980 B2
(45) Date of Patent: Jan. 31, 2017

(54) VAPOR COMPRESSION REFRIGERATION CHUCK FOR ION IMPLANTERS

(75) Inventors: William D. Lee, Newburyport, MA (US); Ashwin M. Purohit, Gloucester, MA (US); Marvin R. LaFontaine, Kingston, NH (US)

(73) Assignee: AXCELIS TECHNOLOGIES, INC., Beverly, MA (US)

( * ) Notice: Subject to any disclaimer, the term of this patent is extended or adjusted under 35 U.S.C. 154(b) by 280 days.

(21) Appl. No.: 12/725,508

(22) Filed: Mar. 17, 2010

(65) Prior Publication Data

US 2010/0171044 A1    Jul. 8, 2010

Related U.S. Application Data

(63) Continuation-in-part of application No. 12/113,091, filed on Apr. 30, 2008.

(51) Int. Cl.
| | |
|---|---|
| *H01L 21/687* | (2006.01) |
| *H01L 21/683* | (2006.01) |
| *H01J 37/20* | (2006.01) |
| *H01J 37/317* | (2006.01) |
| *H01L 21/67* | (2006.01) |

(52) U.S. Cl.
CPC ........... *H01L 21/6831* (2013.01); *H01J 37/20* (2013.01); *H01J 37/3171* (2013.01); *H01L 21/67109* (2013.01); *H01J 2237/002* (2013.01); *H01J 2237/2001* (2013.01); *H01J 2237/2007* (2013.01); *H01J 2237/2065* (2013.01); *H01J 2237/20214* (2013.01); *H01J 2237/31701* (2013.01)

(58) Field of Classification Search
CPC ............ H01L 21/6831; H01L 21/67109; H01J 31/3171
USPC .......................................... 250/492.1, 492.21
See application file for complete search history.

(56) References Cited

U.S. PATENT DOCUMENTS

| | | | |
|---|---|---|---|
| 4,948,269 | A | 8/1990 | Hamilton |
| 5,636,098 | A | 6/1997 | Salfelder et al. |
| 5,754,391 | A | 5/1998 | Bates |
| 5,822,172 | A | 10/1998 | White |
| 5,838,528 | A | 11/1998 | Os et al. |
| 5,880,924 | A * | 3/1999 | Kumar et al. ................ 361/234 |
| 5,975,536 | A | 11/1999 | Helgeland |
| 6,108,189 | A | 8/2000 | Weldon et al. |
| 6,433,346 | B1 | 8/2002 | Hirayanagi |
| 6,552,892 | B2 | 4/2003 | Carroll et al. |

(Continued)

OTHER PUBLICATIONS

Final Office Action dated Mar. 19, 2010 for U.S. Appl. No. 11/641,334. 18 pages.

(Continued)

*Primary Examiner* — Robert Kim
*Assistant Examiner* — Eliza Osenbaugh-Stewar
(74) *Attorney, Agent, or Firm* — Eschweiler & Associates, LLC

(57) ABSTRACT

Aspects of the present invention relate to ion implantation systems that make use of a vapor compression cooling system. In one embodiment, a thermal controller in the vapor compression system sends refrigeration fluid though a compressor and a condenser according to an ideal vapor compression cycle to help limit or prevent undesired heating of a workpiece during implantation, or to actively cool the workpiece.

17 Claims, 7 Drawing Sheets

(56) References Cited

U.S. PATENT DOCUMENTS

| | | | |
|---|---|---|---|
| 6,570,752 | B2 | 5/2003 | Morita et al. |
| 6,629,423 | B1 | 10/2003 | Hirooka et al. |
| 6,684,652 | B2 | 2/2004 | Kim et al. |
| 7,033,443 | B2 | 4/2006 | Kellerman et al. |
| 7,105,838 | B2 | 9/2006 | Naylor-Smith et al. |
| 7,135,691 | B2 * | 11/2006 | Vanderpot et al. ......... 250/492.1 |
| 7,323,695 | B2 | 1/2008 | Vanderpot et al. |
| 7,560,705 | B2 | 7/2009 | Eiriksson et al. |
| 7,697,260 | B2 | 4/2010 | Brown et al. |
| 2001/0005595 | A1 | 6/2001 | Morita et al. |
| 2003/0161088 | A1 | 8/2003 | Migita |
| 2003/0221626 | A1 | 12/2003 | Leavitt et al. |
| 2004/0066601 | A1 * | 4/2004 | Larsen ......................... 361/234 |
| 2005/0219786 | A1 * | 10/2005 | Brown et al. ................ 361/234 |
| 2006/0060259 | A1 | 3/2006 | Devitt |
| 2006/0171094 | A1 * | 8/2006 | Muka et al. .................. 361/234 |
| 2006/0219605 | A1 | 10/2006 | Devitt |
| 2007/0081295 | A1 * | 4/2007 | Brillhart et al. ............. 361/234 |
| 2007/0109714 | A1 | 5/2007 | Chung |
| 2008/0076194 | A1 * | 3/2008 | Blake et al. ...................... 438/5 |
| 2008/0105836 | A1 | 5/2008 | Eiriksson et al. |
| 2008/0137812 | A1 | 6/2008 | Frontera et al. |
| 2008/0144251 | A1 | 6/2008 | Tao et al. |
| 2008/0289767 | A1 * | 11/2008 | Tandou et al. ........... 156/345.53 |
| 2009/0067114 | A1 | 3/2009 | Balan |
| 2009/0273878 | A1 | 11/2009 | Lee et al. |
| 2009/0277883 | A1 | 11/2009 | Tandou et al. |
| 2010/0090413 | A1 | 4/2010 | Mahoney et al. |
| 2010/0164303 | A1 | 7/2010 | Veneruso |
| 2010/0171044 | A1 | 7/2010 | Lee et al. |
| 2011/0062806 | A1 | 3/2011 | Ohashi et al. |
| 2001/0291023 | | 12/2011 | Lee et al. |

OTHER PUBLICATIONS

U.S. Appl. No. 11/840,888, filed Aug. 17, 2007. 36 Pages.
U.S. Appl. No. 11/641,334, filed Dec. 19, 2006. 32 Pages.
U.S. Appl. No. 12/113,091, filed Apr. 30, 2008. 32 Pages.
U.S. Appl. No. 13/116,661, filed May 26, 2011. 26 Pages.
U.S. Appl. No. 13/150,822, filed Jun. 1, 2011. 34 Pages.
Notice of Allowance dated Apr. 6, 2009 for U.S. Appl. No. 11/840,888. 6 Pages.
Non-Final Office Action Dated Jun. 16, 2011 for U.S. Appl. No. 12/113,091. 14 Pages.
Non-Final Office Action Dated Sep. 9, 2009 for U.S. Appl. No. 11/641,334, 16 pages.
"Porous Media Technology", New Way Air Bearings, Jan. 30, 2008, reprinted from the Internet at: http://www.newwayairbearings.com/porous-media-technology , 1 page.
Final Office Action dated Feb. 14, 2012 issued to U.S. Appl. No. 12/113,091.
Non-Final Office Action dated Sep. 12, 2012 for U.S. Appl. 13/116,661.
Non-Final Office Action dated Aug. 13, 2012 for U.S. Appl. No. 13/150,822.
Notice of Allowance dated Mar. 6, 2013 for U.S. Appl. No. 13/150,822.
Final Office Action dated Aug. 26, 2013 for U.S. Appl. No. 13/116,661.
Office Action dated Sep. 11, 2013 for U.S. Appl. No. 12/113,091.
Office Action dated Mar. 25, 2013 for U.S Appl. No. 13/116,661.
Office Action Dated May 1, 2014 U.S. Appl. No. 12/113,091.
Office Action dated Dec. 20, 2012 for U.S. Appl. No. 13/150,822.
Final Office Action dated Jan. 7, 2013 for U.S. Appl. No. 13/116,661.
Notice of Allowance dated Dec. 2012 issued to U.S. Appl. No. 11/641,334.
Notice of Allowance Dated Jan. 23, 2015 U.S. Appl. No. 12/113,091.
Notice of Allowance dated Nov. 18, 2013 for U.S. Appl. No. 13/116,661. 26 Pages.

* cited by examiner

VAPOR COMPRESSION REFRIGERATION CHUCK FOR ION IMPLANTERS

RELATED APPLICATIONS

This application is a continuation-in-part of U.S. Non-provisional application having Ser. No. 12/113,091 and filed Apr. 30, 2008, entitled "GAS BEARING ELECTROSTATIC CHUCK," the content of which is incorporated herein by reference in its entirety.

BACKGROUND

In the manufacture of semiconductor devices and other products, ion implantation systems are used to implant dopant elements into work pieces (e.g., semiconductor wafers, display panels, glass substrates). These ion implantation systems are typically referred to as "ion implanters".

FIG. 1 illustrates one example of an ion implantation system 10 having a terminal 12, a beamline assembly 14, and an end station 16. Generally speaking, an ion source 18 in the terminal 12 is coupled to a power supply 20 to ionize a dopant gas and form an ion beam 22. The ion beam 22 is directed through a beam-steering apparatus 24, and out an aperture 26 towards the end station 16. In the end station 16, the ion beam 22 bombards a work piece 28 (e.g., a semiconductor wafer, or a display panel), which is detachably mounted to an electrostatic chuck 30. Once embedded into the lattice of the workpiece 28, the implanted ions change the physical and/or chemical properties of the workpiece. Because of this, ion implantation is used in semiconductor device fabrication and in metal finishing, as well as various applications in materials science research.

Absent countermeasures, during the ion implantation process energy can build up on the workpiece 28 in the form of heat as the charged ions collide with the workpiece. This heat can warp or crack the workpiece, which may render the workpiece worthless (or significantly less valuable) in some implementations.

In addition, even if the workpiece is not rendered worthless, this undesired heating can cause the dose of ions delivered to differ from the dosage desired, which can alter the functionality from what is desired. For example, if a dose of $1 \times 10^{17}$ atoms/cm$^3$ are desired to be implanted in an extremely thin region just below the outer surface of the workpiece, unexpected heating could cause the delivered ions to diffuse out from this extremely thin region such that the dosage actually achieved is less than $1 \times 10^{17}$ atoms/cm$^3$. In effect, the undesired heating can "smear" the implanted charge over a larger region than desired, thereby reducing the effective dosage to less than what is desired. Other undesirable effects could also occur.

In other instances it might be desired to implant at a temperature below ambient temperature, to allow the chuck to be cooled to very low temperatures. For these and other reasons, cooling systems have been developed. Although cooling systems are known in some respects, such as in plasma processing apparatuses, it is extremely difficult to integrate a vapor cooling system into an ion implanter due to the mechanical density of components near the workpiece. For example, electrostatic chucks in ion implanters are often considerably more complicated that those used in run-of-the-mill plasma processing apparatuses. Consequently, the inventors have developed techniques for cooling electrostatic chucks in ion implantation systems, which can reduce undesired heating of workpieces undergoing implantation.

SUMMARY

The present invention overcomes the limitations of the prior art by providing a system, apparatus, and method for clamping workpieces in a semiconductor processing system. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

Aspects of the present invention relate to ion implantation systems that make use of a vapor compression cooling system. In one embodiment, a thermal controller in the vapor compression system sends refrigeration fluid though a compressor and a condenser according to an ideal vapor compression cycle to help limit or prevent undesired heating of a workpiece during implantation, or to actively cool the workpiece.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
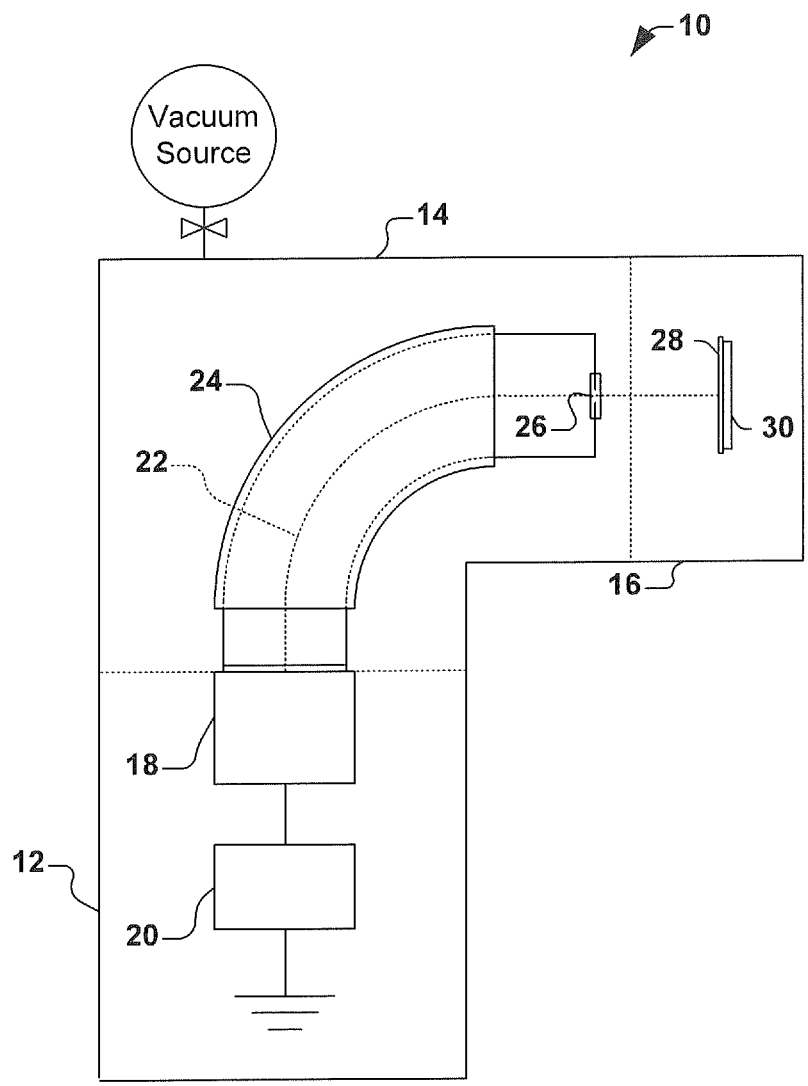
FIG. 1 illustrates a block diagram of a conventional ion implantation system.

The present invention is directed generally toward cooling techniques that can be used in conjunction with an electrostatic clamp or chuck (ESC) that provides improved clamping and thermal uniformity, while further decreasing backside particle contamination. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
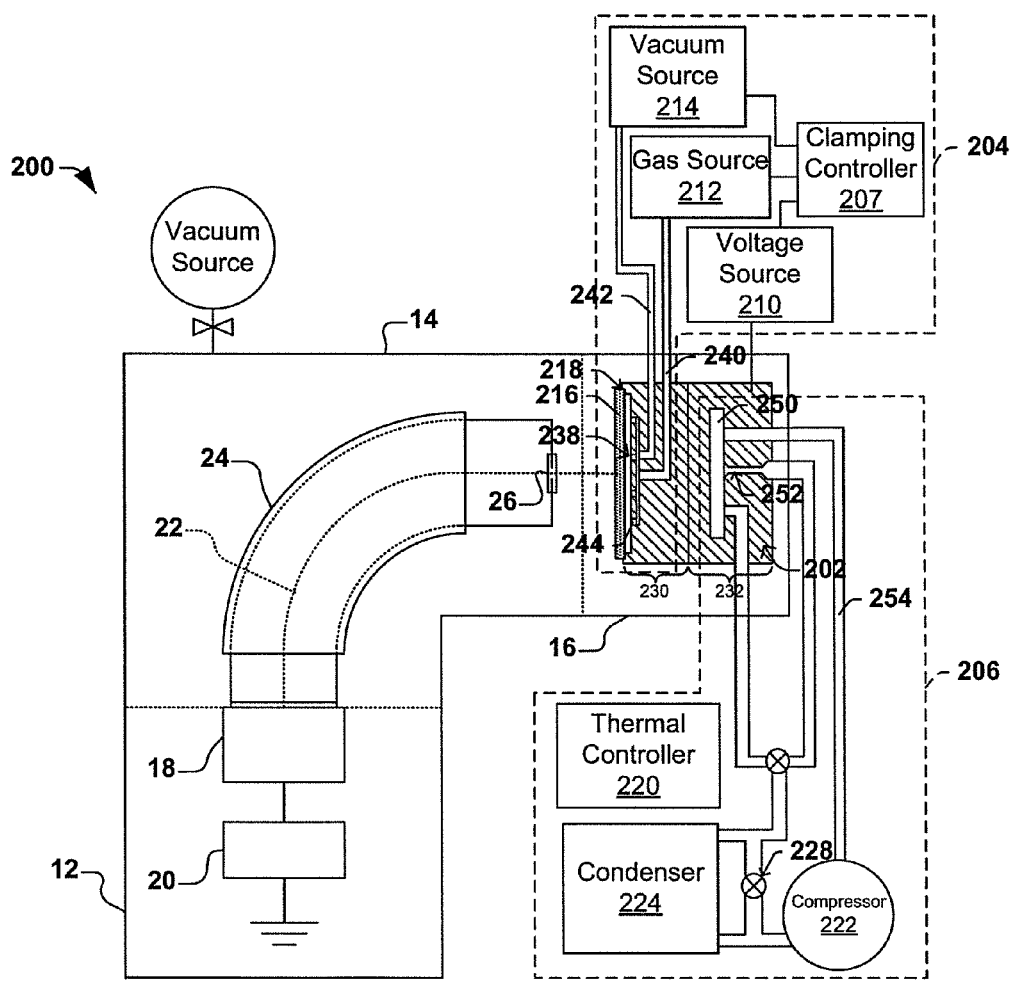
FIG. 2 illustrates a block diagram of an ion implantation system according to one embodiment.

FIG. 2 shows one example of an ion implantation system 200 in accordance with some aspects of the present invention. In particular, FIG. 2's embodiment includes an electrostatic chuck 202 operably coupled to both a clamping control system 204 and a vapor compression cooling system 206. Generally speaking, the clamping control system 204 selectively adheres a workpiece 216 to an engagement region 218 of the electrostatic chuck 202. While the workpiece 216 is selectively adhered to the engagement region 218, the vapor compression system cools the chuck 202 to help limit or prevent undesired heating of the workpiece 216 during implantation.

The electrostatic chuck 202 includes a first plate 230 and a second plate 232, which are often separate components, but which can be fused into a single body in some embodiments. The first plate 230 includes the engagement region 218 to which the workpiece 216 is detachably engaged.

Figure 3:
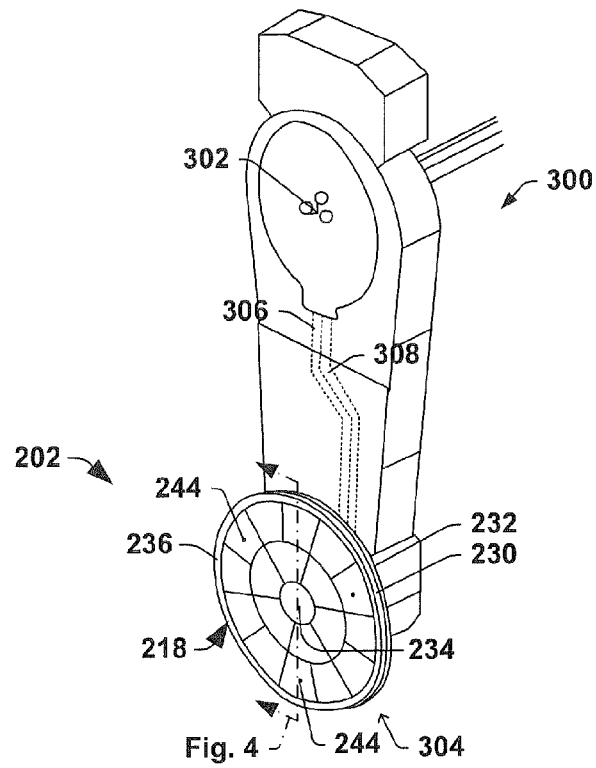
FIG. 3 is a perspective view of a scan arm including an electrostatic chuck according to one embodiment.
Figure 4:
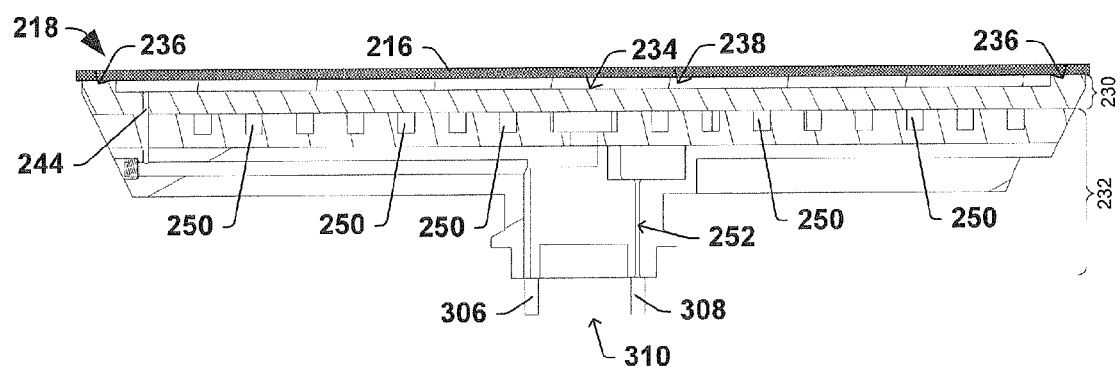
FIG. 4 is a simplified cross-sectional view an exemplary electrostatic chuck according to FIG. 3's embodiment.

Briefly referring to FIGS. 3-4, one can see that the engagement region 218 comprises a central region 234, which is often recessed with regards to an annulus region 236 disposed about a periphery of the central region 234. Because the central region 234 is recessed with respect to the annulus region 236, a cavity 238 is formed between a backside region of the workpiece 216 and the central region 234. This cavity 238 limits direct surface-to-surface contact between the workpiece 216 and the electrostatic chuck 202, thereby helping to limit contamination of the workpiece and limiting the number of defects on the workpiece.

Referring back to FIG. 2, to couple the cavity 238 to a pressurized gas source 212 and a vacuum source 214, a supply conduit 240 and exhaust conduit 242, respectively, are in fluid communication with the cavity 238 via one or more gas supply orifices 244 extending through the central region of the first plate.

To adhere the workpiece 216 to the electrostatic chuck, an electrode in the electrostatic chuck 202 is biased by the voltage source 210. Thus, as shown in FIG. 2, the clamping controller 207 balances the bias voltage on the electrode (which tends to cause the workpiece 216 to "stick" to the engagement region 218) relative to the gas supplied to the cavity 238 (which tends to push the workpiece 216 away from the engagement region 218.) Thus, when the electrode is biased, the gas in the cavity 238 acts as a cushion in some respects. In this manner, the clamping control system 204 can selectively adhere and release the workpiece 216 to and from the engagement region 218 so ion implantation can be accurately carried out on the workpiece.

To help limit or prevent undesired heating of the workpiece during implantation, or to chill the work piece during implantation, the second plate 232 of the electrostatic chuck 202 also includes one or more cooling channels 250 and a flow restrictor 252. During operation, the compressor 222 receives a refrigerant fluid, which can be in a vapor phase, from a return conduit 254. The compressor 222 compresses the refrigerant fluid (e.g., a hydro-fluorocarbon, ammonia, carbon dioxide, etc.) to increase the pressure of the fluid. The condenser 224 then condenses the pressurized fluid by removing heat therefrom, and provides the condensed fluid through a supply conduit 256 towards the electrostatic chuck 202. The fluid continues into the flow restrictor 252, where the fluid is expanded (vaporized) and cooled. As the cooled vapor passes into the cooling channel 250, the vapor absorbs heat from the electrostatic chuck. The vapor, which is now heated, returns to the compressor 222 through the return conduit 254 to undergo another cycle. In this manner, the vapor compression cooling system can help regulate the temperature of the chuck to limit or prevent undesired heating, or to actively cool.

The use of a flow restrictor 252 is advantageous over other components because its sidewalls, which are tapered to be closer together in a central region and further apart at the distal ends of the flow restrictor, are compatible with relatively dense layouts used for ion implantation electrostatic chucks. Thus, even though other components (e.g., valves) could be used in some implementations, the use of a flow restrictor is particularly advantageous in ion implantation systems because of tight geometry constraints often present in electrostatic chucks.

Figure 9:
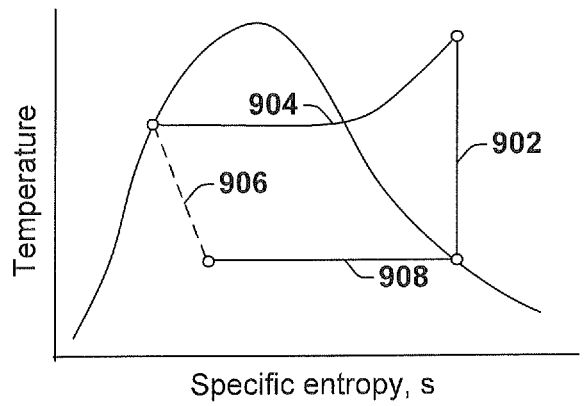
FIG. 9 shows a vapor compression refrigeration cycle that can be carried out according to one embodiment.

FIG. 9 shows a vapor compression refrigeration cycle 900 that can be carried out by the vapor compression cooling system. In the cycle, the fluid is first compressed in the compressor by increasing the pressure, which leads to an isentropic temperature rise (902). The fluid is then condensed by the condenser at constant pressure by removing heat (904). The flow restrictor then has the fluid do work on the system, after which the fluid expands in the cooling channel (906). As the fluid expands, it absorbs heat from the electrostatic chuck (908). The cycle can repeat in this manner.

FIG. 3 shows an example of a scan arm 300 on which the electrostatic chuck 202 can be mounted, and FIG. 4 shows a cross sectional view of the electrostatic chuck as indicated. For purposes of clarity, note that FIG. 3 shows the electrostatic chuck 202 without a workpiece attached thereto, while FIG. 4 includes a workpiece 216 adhered to the electrostatic chuck 202.

As will be appreciated in more detail below, the scan arm 300 extends in a radial direction between a pivot point 302 and a distal end 304, wherein the distal end 304 comprises the engagement region 218 to which a workpiece 216 can be selectively attached. A gas supply conduit 306 and a separate refrigerant supply conduit 308 extend between the pivot point 302 and the distal end 304. The gas supply conduit 306 is in fluid communication with the cavity 238 via the one or more gas supply orifices 244. The refrigerant supply conduit 308 is in fluid communication with the one or more cooling channels 250, which are fluidly isolated from both the gas supply orifices 244 and the cavity 238. The scan arm also includes an axial hub 310 by which the electrostatic chuck is coupled to the distal end of the scan arm.

Figure 5A:
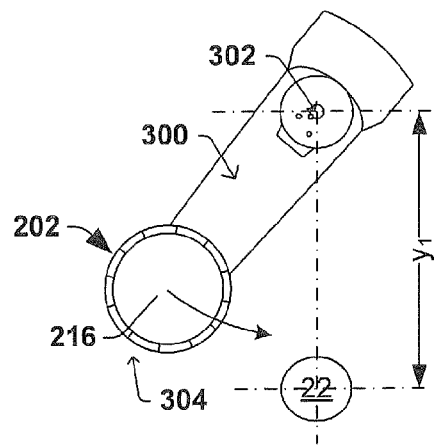
FIGS. 5A-5F are a series of views illustrating movement of a scan arm with respect to an ion beam according to one embodiment.
Figure 5B:
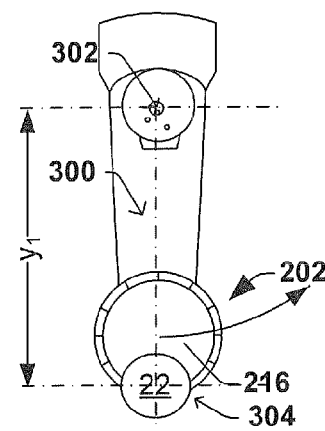
Figure 5C:
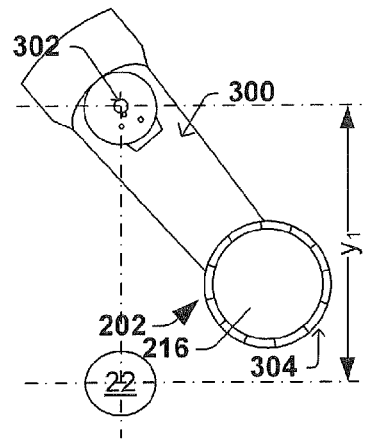
Figure 5D:
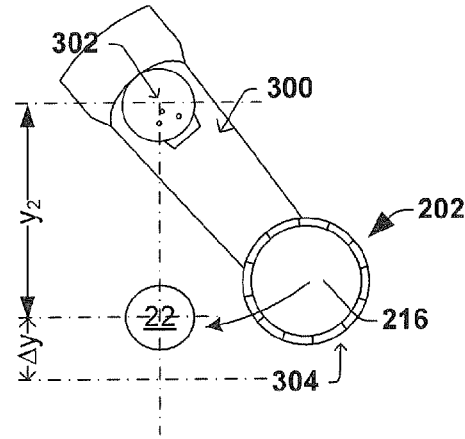
Figure 5E:
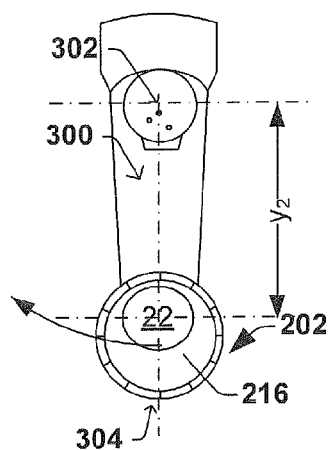
Figure 5F:
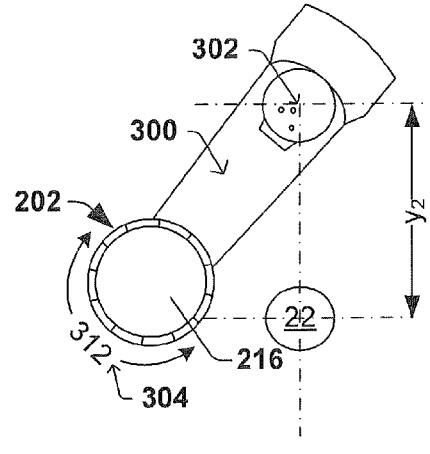

For the convenience of explanation, FIG. 5A-5F show one manner in which the scan arm 300 having a workpiece 216 adhered thereto can sweep across an ion beam 22 in time. In FIG. 5A-5C, scan arm 300 sweeps the workpiece 216 about the pivot point 302 while the pivot point is separated from the center of the ion beam 22 by a first distance $y_1$. In FIG. 5D, the pivot point 302 of the scan arm has incrementally moved a distance $\Delta y$ relative to the center of the ion beam 22. Thus, when the scan arm 300 sweeps the workpiece 216 through the ion beam 22 in FIGS. 5D-5F, the ion beam 22 collides with a different area on the workpiece 216. Ion implantation can continue as the ion beam 22 and pivot point 302 are incrementally moved with regards to one another until the entire workpiece has been implanted. In addition, the electrostatic chuck can often rotate about its axial hub 310 (e.g., as shown by 312), while scan arm is moving in the pendulum-like manner.

Although FIG. 5A-5F show an example of a pendulum-like scanning system, in other embodiments (not illustrated), the ion beam can be electrically or magnetically scanned back and forth at a fast scan rate on a first axis (e.g., horizontal axis), while the scan arm on which the workpiece is selectively mounted is translated at a slow translation rate on a second axis (e.g., vertical axis). In still other embodiments, the ion beam can be static with regards to the surface of the workpiece.

Figure 6:
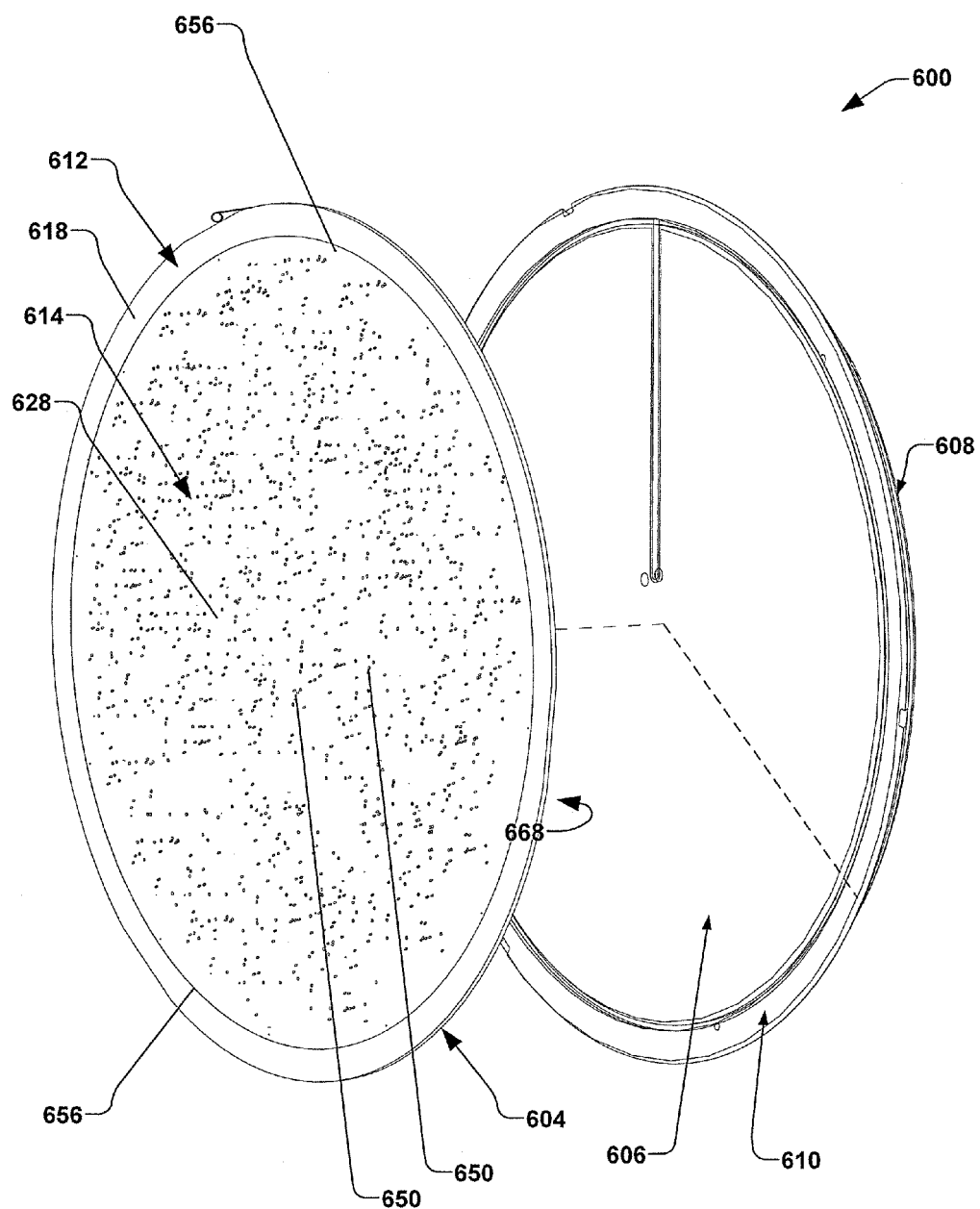
FIG. 6 illustrates an exploded perspective view on an electrostatic chuck according to one exemplary aspect of the present invention.

FIG. 6 illustrates an exploded perspective view of another embodiment of an electrostatic clamp 600, also referred to as an "ESC". The ESC 600 shown in FIG. 6, for example, comprises a clamping plate 604 (which may also be referred to as a first plate in some embodiments), and a cooling plate 608 (which may also be referred to as a second plate in some embodiments). A first electrode 606, and a second electrode 610 are also included in the ESC. Although only first and second electrodes 606, 610 are shown, it will be appreciated that any number of electrodes are contemplated as falling within the scope of the present invention.

The clamping plate 604 comprises an annulus region 612 and a central region 614 defined therein, wherein the annulus region is generally disposed about a periphery of the central region. The annulus region 612 comprises a first surface 618 associated therewith, wherein the first surface, in one example, is configured to make surface-to-surface contact with a workpiece (not shown). The central region 614 includes a second surface 628, which is generally recessed from the first surface 618 by a predetermined distance. Thus, when the workpiece is engaged to the clamping plate, a cavity is defined between the second surface 628 of the clamping plate and a backside surface of the workpiece.

The second surface 628 is generally recessed from the backside surface of the workpiece by between approximately 0 and 100 microns in some embodiments. In one particular example, the second surface 628 is generally recessed from the first surface 618 by approximately 10 microns. Thus, when a workpiece is placed on the ESC 600, the annulus region 612 is operable to generally isolate the central region 614 from an external environment (e.g., a vacuum chamber, process chamber, or the like). In accordance with one exemplary aspect, the annulus region 612 of the clamping plate 604 is comprised of an elastomeric material (e.g., an elastomeric seal), wherein the elastomeric material generally defines the first surface 618. The elastomeric material thus provides a seal between the workpiece and the clamping plate 604, wherein the central region 614 is generally isolated from an external environment.

In accordance with another example, the annulus region 612 and central region 614 of the clamping plate 604 comprise a J-R type material (e.g, alumina doped with titanium, aluminum nitride doped with cerium oxide, or the like). A J-R material (e.g., a semiconductive dielectric material having a bulk resistivity between $1 \times 10^8$ to $1 \times 10^{12}$ Ohm-cm) has an advantage over non-doped materials in a J-R-type ESC 600 because the clamping plate 604 can be substantially thick (e.g., a thickness of 0.5 mm or more), and does not require subsequent thinning by machining, grinding, or other techniques in order to produce useful clamping forces. Alternatively, the annulus region 612 and central region 614 of the clamping plate 604 comprise a non-J-R material, wherein the ESC 600 can be considered anon-J-R or Coulombic-type clamp.

In accordance with one example, the first electrode 606 the ESC 600 illustrated in FIG. 6 is associated with the central region 614, and the second electrode 610 is associated with the annulus region 612, wherein the first electrode and second electrode are generally electrically isolated from one another. One or more of the first electrode 606 and second electrode 610, for example, are comprised of one or more of silver, gold, titanium, tungsten, or other electrically conductive metal or material. The first electrode 606 and the second electrode 610 of the ESC 600 can be respectively electrically connected to a respective first voltage source (e.g., a first voltage potential) and second voltage source (e.g., a second voltage potential).

The clamping plate 604 further comprises comprise a plurality of gas supply orifices 650 associated with the central region 614, wherein the plurality of gas supply orifices are in fluid communication with a pressurized gas source or supply (e.g., gas source 212 in FIG. 2). The plurality of gas supply orifices 650, for example, are configured to provide a cushion of gas (not shown) between the clamping surface (e.g., the second surface 628) and a surface of the workpiece.

In accordance with yet another embodiment, one or more gas return orifices 656 are defined in one or more of the central region 614 and annulus region 612 of the clamping plate 604. The one or more gas return orifices 656, for example, are in fluid communication with a vacuum source (e.g., vacuum source 214 of FIG. 2). The one or more gas return orifices 656, for example, may comprise one or more grooves and holes disposed about an interface between the annulus region 612 and the central region 614, thus providing an exhaust path for the cushioning gas (not shown) through the ESC 600.

The annulus region 612, for example, is further operable to provide a substantial seal between the surface 120 of the workpiece and the ESC 600, wherein the cushioning gas is generally maintained within a volume defined by the annulus region, the central region 614, and the workpiece. By controlling a pressure and flow of the cushioning gas from the plurality of gas supply orifices 650 and back through the one or more gas return orifices 656 (e.g., via the gas source and vacuum source of FIG. 2), the clamping plate 604 is operable to provide a first force to generally repel the workpiece from the ESC 600. The pressure and flow of cushioning gas from the plurality of gas supply orifices 650 can thus generally counteract electrostatic forces associated with the voltage potentials applied to the first electrode 606 and the second electrode 610 via the first voltage source and second voltage source. Such a counteraction or balancing of forces is thus operable to provide a generally frictionless interface between the workpiece and at least the central region 614 of the clamping plate 604. Further, by controlling a pressure and flow of the cushioning gas from the plurality of gas supply orifices 650 and through the one or more gas return orifices 656, a transfer of heat between the workpiece and the ESC 600 can also be controlled, depending on the flow and temperature of the cushioning gas.

In one example, the one or more gas return orifices 656 have a diameter of approximately 2 millimeters or less, however, various other sized holes are also contemplated as falling within the scope of the present invention. For example, the one or more gas return orifices 656 can have a diameter of approximately 500 microns. The size of the gas return orifices can be varied based on pressure(s) and flow rate(s), and thus can be optimized for any given application of the ESC 600.

In one alternative, the one or more gas return orifices 656 of FIG. 6 comprise one or more slits (not shown), wherein the one or more slits generally extend a predetermined distance (not shown) along the interface between the annulus region 612 and the central region 614. For example, the one or more slits may comprise linear or arcuate slits, wherein a radial width of the one or more arcuate slits, as measured as extending along a radius of the ESC 600, can be approximately 2 millimeters or less when measured between the annulus region 612 and the central region 614. A length of the one or more elongate slits, for example, can be substantially larger than the radial width thereof. In accordance with yet another exemplary aspect of this disclosure, the cooling plate 608 of the ESC 600 of FIG. 6 is associated with a backside 668 of the clamping plate 604, as previously illustrated in FIG. 4.

Figure 7:
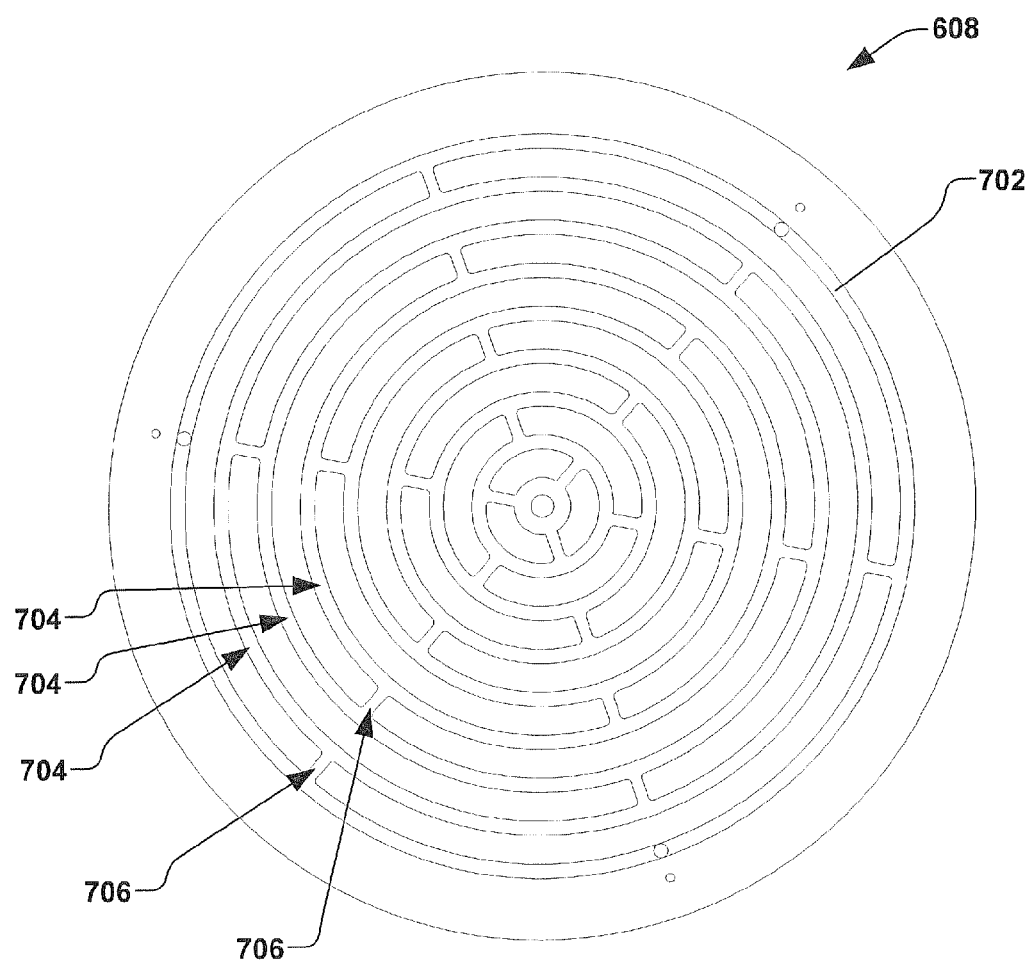
FIG. 7 illustrates a top plan view of an exemplary cooling plate according to yet another aspect of the present invention.

FIG. 7 shows another example of a cooling plate 608, which comprises one or more cooling channels 702. The one or more cooling channels 702, for example, are configured to route the refrigerant fluid (not shown) such as hydrofluorocarbon, or others, between the clamping plate 604 and the cooling plate 608 and/or through the cooling plate for cooling of the ESC 600 during semiconductor processing. FIG. 7 illustrates an exemplary front surface of the cooling plate 608, wherein the front surface of the cooling plate generally interfaces with the backside 668 of the clamping plate 604 of FIG. 6, for example. It should be noted that the illustrated predetermined pattern of cooling channels can differ from that illustrated in the figures, and all such patterns are contemplated as falling within the scope of the present invention.

As illustrated in FIG. 7, the one or more cooling channels 702 associated with the front surface of the cooling plate 608 comprise a plurality of generally concentric channels 704 that are generally interconnected via a plurality of radial passages 706. The exemplary plurality of concentric channels 704, radial passages 706, for example, generally provide an advantageous flow of cooling fluid therethrough, wherein air bubbles are generally minimized.

In some un-illustrated embodiments, the clamping plate 604 further comprises a plurality of pins, stops, or other features disposed about a periphery thereof, wherein the plurality of pins are configured to interface with the peripheral region of the workpiece during handling and/or processing of the workpiece. For example, three or more pins extend generally perpendicularly to the first surface about the periphery of the clamping plate, wherein the pins generally prevent lateral motion of the workpiece during a scanning of the workpiece. The pins, for example, are selectably positioned to maintain the position of the workpiece when the cushioning gas is supplied.

Figure 8:
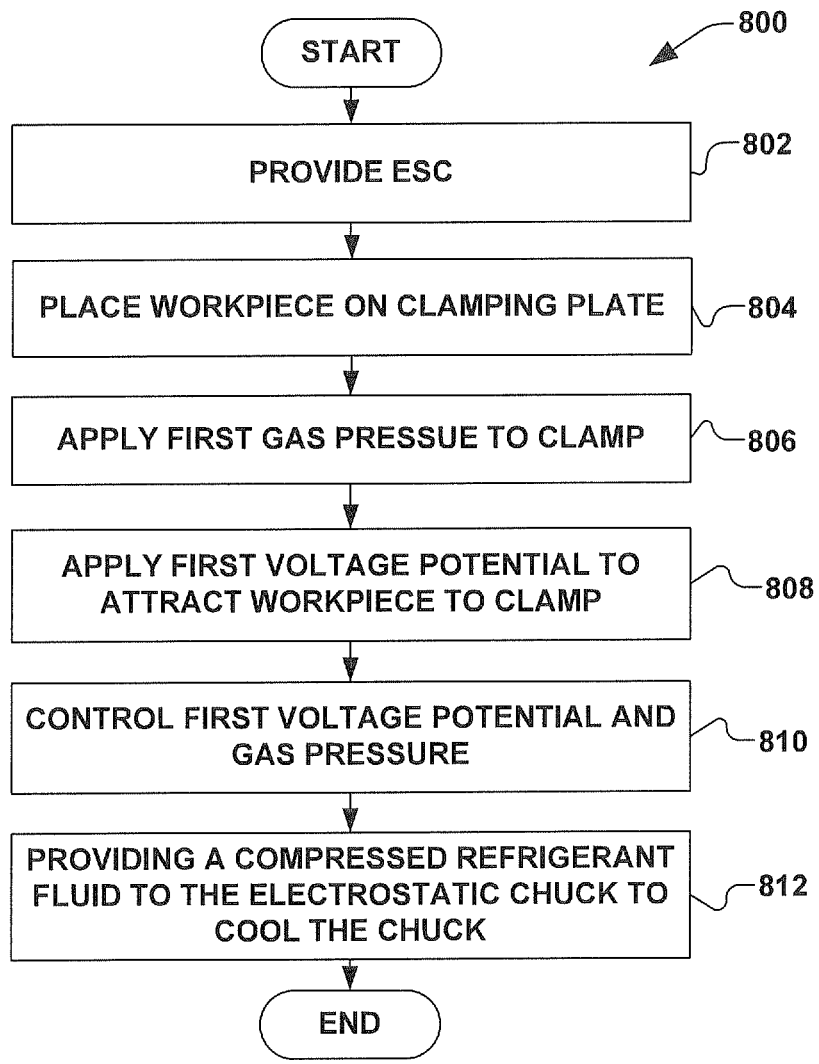
FIG. 8 is a block diagram illustrating an exemplary method for clamping a workpiece in accordance with the present invention.

In accordance with another aspect of the present invention, FIG. 8 illustrates an exemplary method 800 for clamping a workpiece via an electrostatic chuck. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 8, the method 800 begins with act 802, wherein an electrostatic chuck, such as the ESC of FIGS. 2-7 is provided. The ESC that is provided in act 802, for example, comprises a clamping plate, wherein the clamping plate comprises a central region and an annulus region defined therein, and wherein a first electrode is associated with at least the central region. The clamping plate further comprises a plurality of gas supply orifices associated with the central region, and one or more gas return orifices.

In act 804, a workpiece is placed over the clamping plate, wherein, in one example, a peripheral region of the workpiece contacts the annulus region of the clamping plate. A cushioning gas is provided via the a cushioning gas supply through the plurality of gas supply orifices at a first gas pressure in act 806, wherein the cushioning gas generally repels the workpiece from the clamping plate with a first repelling force. The cushioning gas pressure generally determines an amount of force and heat transfer between the workpiece and the clamping plate. In act 808, a first voltage potential is applied to the first electrode, therein generally attracting the workpiece to the clamping plate with a first attractive force (e.g., a first clamping force).

In act 810, the first voltage potential and the cushioning gas pressure are controlled, wherein the first voltage potential generally attracts the workpiece to the clamping plate with the first force, and cushioning gas pressure generally provides an opposing or repelling force. In one example, the first attractive force and the first repelling force are equalized by the control of act 810, therein providing a generally frictionless interface between the workpiece and at least the central region of the clamping plate.

In act 812, a compressed refrigerant fluid is provided to the electrostatic chuck to cool the chuck. In some embodiments, the compressed refrigerant is provided to the electrostatic chuck via a flow restrictor, where the flow restrictor comprises a central region having sidewalls separated by a first distance and distal regions having sidewalls separated by a second distance that is greater than the first distance.

The first attractive force associated with the first voltage potential applied to the first electrode in act 806, in one example, is sufficient to generally maintain a position of the workpiece with respect to the clamping plate, and to provide a substantial seal between the workpiece and the annulus region to prevent leakage of the cushioning gas to an external environment. In another example, the differential pumping grooves provide the seal between the workpiece and the clamping plate to prevent leakage of the cushioning gas to the external environment.

Accordingly, the present invention provides an electrostatic chuck that provides improved thermal control over the work piece. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system comprising:
    a beamline assembly configured to steer an ion beam from an ion source towards an electrostatic chuck, wherein the electrostatic chuck includes an engagement region adapted to selectively retain a workpiece for implantation by the ion beam;
    a compressor configured to receive vapor-phase refrigerant fluid from the electrostatic chuck and compress the vapor-phase refrigerant fluid to provide a compressed refrigerant fluid;
    a condenser configured to condense the compressed refrigerant fluid to provide a condensed refrigerant fluid; and
    a supply conduit to transport the condensed refrigerant fluid from the condenser to the electrostatic chuck, wherein the electrostatic chuck includes a cavity or recess to expand and vaporize the condensed refrigerant fluid to cool the engagement region of the electrostatic chuck, and wherein the cavity or recess comprises:
        a flow restrictor which is defined in a body of the electrostatic chuck; and
        a cooling channel which is disposed in the body of the electrostatic chuck and which is downstream of the flow restrictor, wherein the flow restrictor comprises:
            first and second distal flow restrictor regions having respective sidewalls separated by a first flow restrictor width, wherein the first distal flow restrictor region is proximate to the supply conduit and the second distal flow restrictor region is proximate to the cooling channel; and
            a central flow restrictor region separating the first and second distal flow restrictor regions and having sidewalls separated by a second flow restrictor width that is greater than the first flow restrictor width.

2. The ion implantation system of claim 1, wherein the compressor is configured to compress the vapor-phase refrigerant fluid though an isentropic temperature rise.

3. The ion implantation system of claim 1, wherein the condenser is configured to condense the compressed refrigerant fluid at a constant pressure by removing heat from the refrigerant fluid.

4. The ion implantation system of claim 1, wherein the electrostatic chuck comprises:
    a first plate having first and second opposing face regions, the first face region corresponding to the engagement region; and
    a second plate having third and fourth opposing face regions, wherein the third face region meets the second face region of the first plate and wherein the cavity or recess is disposed within a body of the second plate between the third and fourth opposing face regions.

5. The ion implantation system of claim 4, further comprising:
    a clamping control system operably coupled to the first plate and configured to selectively retain a workpiece on an engagement region of the first plate.

6. The ion implantation system of claim 5, wherein the clamping system comprises:
    a voltage source operably coupled to the electrostatic chuck;
    a gas source and vacuum source that are in fluid communication with a cavity or recess arranged within the first plate and corresponding to the engagement region;
    wherein the voltage, gas, and vacuum sources are configured to act under direction of a clamping controller to selectively retain and release the workpiece from the engagement region of the electrostatic chuck.

7. An ion implantation system comprising:
    an ion source configured to provide an ion beam;
    a beamline assembly configured to steer the ion beam from the ion source towards an electrostatic chuck, wherein the electrostatic chuck includes a body made up of first and second plates;
    a clamping control system operably coupled to the first plate and configured to selectively retain a workpiece on an engagement region of the first plate; and
    a vapor compression cooling system operably coupled to the second plate and including one or more cooling channels in the second plate in which a vapor phase refrigerant is provided to cool the engagement region and thereby cool the workpiece, wherein the vapor compression cooling system comprises:
        a compressor configured to receive vapor-phase refrigerant fluid from the electrostatic chuck and compress the vapor-phase refrigerant fluid to provide a compressed refrigerant fluid;
        a condenser configured to condense the compressed refrigerant fluid to provide a condensed refrigerant fluid; and
        a supply conduit to transport the condensed refrigerant fluid from the condenser to the electrostatic chuck, wherein the electrostatic chuck includes a flow restrictor and cooling channel defined in a body thereof, wherein the flow restrictor and cooling channel expand the condensed refrigerant fluid to vapor-phase to cool the engagement region of the electrostatic chuck, and wherein the flow restrictor comprises:
            first and second distal flow restrictor regions having respective sidewalls separated by a first flow restrictor width, wherein the first distal flow restrictor region is proximate to the supply conduit and the second distal flow restrictor region is proximate to the cooling channel; and
            a central flow restrictor region separating the first and second distal flow restrictor regions and having sidewalls separated by a second flow restrictor width that is greater than the first flow restrictor width.

8. The ion implantation system of claim 7, wherein the compressor is configured to compress the vapor-phase refrigerant fluid though an isentropic temperature rise.

9. The ion implantation system of claim 8, wherein the condenser is configured to condense the compressed refrigerant fluid at a constant pressure by removing heat from the refrigerant fluid.

10. The ion implantation system of claim 7, wherein the clamping system comprises:
    a voltage source operably coupled to the electrostatic chuck;
    a gas source and vacuum source that are in fluid communication with a cavity or recess corresponding to the engagement region of the first plate;
    wherein the voltage, gas, and vacuum sources are configured to act under direction of a clamping controller to selectively retain and release the workpiece from the engagement region of the electrostatic chuck.

11. The ion implantation system of claim 7, wherein the first plate comprises:
an annulus region configured to make surface to surface contact with the workpiece; and
a central region circumscribed by the annulus region and being recessed relative to the annulus region by a predetermined distance; wherein a cavity is defined between the central region and a backside of the workpiece when the workpiece is retained on the engagement region of the first plate.

12. The ion implantation system of claim 11, wherein the annulus region and central region comprise a semiconductor dielectric material having a bulk resistivity between $1\times10^8$ to $1\times10^{12}$ ohm-cm.

13. The ion implantation system of claim 11, wherein the central region comprises one or more gas supply orifices and one or more gas return orifices to provide a fluid path by which a cushion of gas is to be provided between the central region and the backside of the workpiece, wherein the gas return orifices have an average diameter ranging from 2 millimeters and 500 microns.

14. A method comprising:
placing a workpiece on an engagement region of an electrostatic chuck;
receiving vapor-phase refrigerant fluid at a first temperature from the electrostatic chuck and compressing the vapor-phase refrigerant fluid to provide a compressed refrigerant fluid;
condensing the compressed refrigerant fluid to provide a condensed refrigerant fluid;
transporting the condensed refrigerant fluid to the electrostatic chuck; and
cooling the engagement region of the electrostatic chuck by expanding the condensed refrigerant fluid within the electrostatic chuck to vaporize the condensed refrigerant to exhibit a second temperature, which is less than the first temperature, wherein the condensed refrigerant fluid is vaporized within the electrostatic chuck via a flow restrictor that is defined within a body of the electrostatic chuck.

15. The method of claim 14, wherein the vapor-phase refrigerant fluid is compressed though an isentropic temperature rise.

16. The method of claim 14, wherein the compressed refrigerant fluid is condensed at a constant pressure by removing heat from the compressed refrigerant fluid.

17. The method of claim 14, wherein the flow restrictor comprises a central region having sidewalls separated by a first distance and distal regions having sidewalls separated by a second distance that is greater than the first distance.

* * * * *